United States Patent
Brown et al.

(10) Patent No.: US 6,636,102 B1
(45) Date of Patent: Oct. 21, 2003

(54) POLYFUSE TRIM READ CELL

(75) Inventors: Gary Brown, Fremont, CA (US); Siew Siong Teo, Sunnyvale, CA (US); Luan Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/060,696

(22) Filed: Jan. 30, 2002

Related U.S. Application Data

(60) Provisional application No. 60/265,570, filed on Jan. 31, 2001.

(51) Int. Cl.[7] .............................................. H01H 85/00
(52) U.S. Cl. ....................... 327/525; 365/201
(58) Field of Search ................................ 327/210, 525, 327/524; 365/200, 201

(56) References Cited

U.S. PATENT DOCUMENTS 5,579,263 A * 11/1996 Teel et al. .................. 365/220
5,862,087 A * 1/1999 Lee ............................ 365/200

* cited by examiner

*Primary Examiner*—Dinh T. Le
(74) *Attorney, Agent, or Firm*—Stallman & Pollock LLP

(57) ABSTRACT

A polysilicon fuse trim read cell utilizes a fuse structure in a single bit memory cell. When the fuse structure is blown, the memory cell can be read and its stored value retained as a digital output. The cell uses no power in the steady state.

5 Claims, 2 Drawing Sheets

POLYFUSE TRIM READ CELL

RELATED APPLICATION

The present application claims the benefit of U.S. Provisional Patent Application No. 60/265,570, filed Jan. 31, 2001, titled "TRIM BIT CIRCUIT FOR BAND-GAP REFERENCE," which is hereby incorporated by reference in its entirety.

BACKGROUND OF THE INVENTION

1. Field of the Invention

The present invention relates to semiconductor integrated circuits and, in particular, to a polysilicon fuse trim read cell that utilizes a fuse structure which, when blown, allows the cell to be read and its value retained as a digital output. The cell uses no power in the steady state.

2. Discussion of the Related Art

The increasing use of handheld and portable electronic devices is driving the need for power management in the operation of the integrated circuits utilized in these devices.

Many electronic systems incorporate a bandgap circuit that generates a reference voltage that is used for operation of other circuits in the system. The bandgap circuit is typically "trimmed" during its testing to adjust the circuit to compensate for the impact of environmental effects, e.g. ambient temperature, during operation. The trimmed bandgap circuit is more reliable in providing a nonvariable reference voltage.

In one technique for trimming a bandgap circuit, a digital control signal is provided to a variable resistor structure in the bandgap circuit. The selected value of the control signal sets the resistance and, thus, adjusts the operation of the bandgap circuit. The control signal is generated by a trim circuit that draws current during its operation and, therefore, can drain the battery of handheld and portable devices.

SUMMARY OF THE INVENTION

A preferred embodiment of the present invention provides a single bit trim read cell that utilizes a polysilicon fuse which, when blown, allows the cell to be read and its stored value to be retained, but which uses no power in the steady state. The fuse is either blown or not blown at circuit test. The trimpad is then used to program an associated single bit storage cell, such as a flip-flop, through a transmission gate that is activated by an input read signal during power up. The data output of the storage cell may be used, for example, as one bit of a multibit programming control signal used in trimming a bandgap reference generator circuit; the remaining bits of the control signal may be provided by similar trim read cell circuits.

A better understanding of the features and advantages of the present invention will be obtained by reference to the following detailed description and accompanying drawings that set forth an illustrated embodiment in which the principles of the invention are utilized.

DETAILED DESCRIPTION OF THE INVENTION

Figure 1:
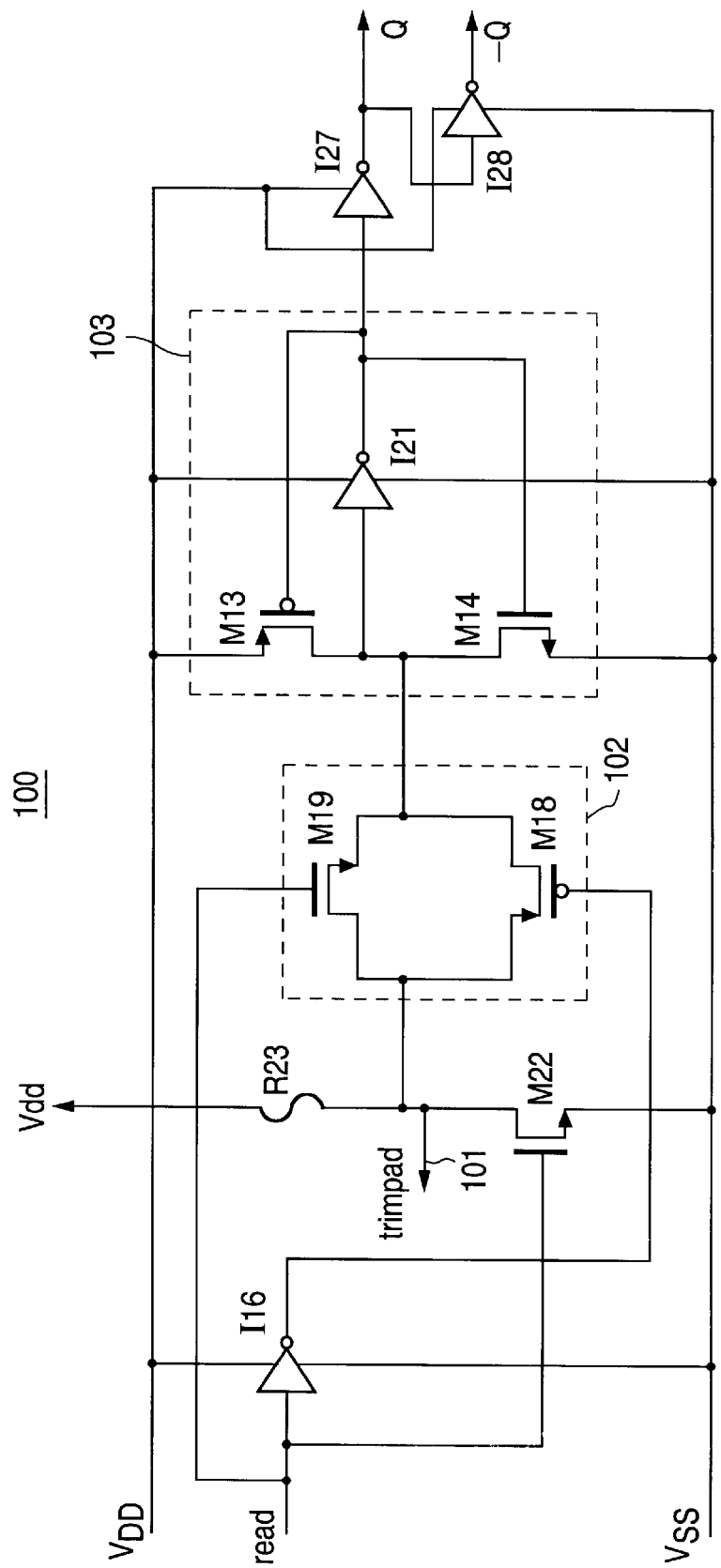
FIG. 1 is a schematic drawing illustrating a polyfuse trim read cell in accordance with the present invention.

FIG. 1 shows a polyfuse trim read cell circuit 100 in accordance with the present invention. The trim read cell circuit 100 includes a transmission gate 102 that includes P-channel transistor M18 and N-channel transistor M19. P-channel transistor M18 has its gate connected to receive a read input signal via inverter I16. The source of P-channel transistor M18 is connected to a trimpad node 101. The gate of N-channel transistor M19 is connected to receive the read input signal directly. Thus, the read input signal turns both P-channel transistor M18 and N-channel transistor M19 on when active high, thereby connecting the trimpad node 101 to the output of the transmission gate 102.

As shown in FIG. 1, the read input signal is also provided directly to the gate of an N-channel transistor M22. N-channel transistor 22 has its source connected to a low power supply Vss and its drain connected to the trimpad node 101. The drain of N-channel transistor M22, and thus the trimpad node 101, are also connected to a power supply voltage Vdd via a fuse R23 of less than 100 ohm resistance. Fuse R23 can be metal, but preferably is polysilicon.

As further shown in FIG. 1, the trim read cell circuit 100 also includes a flip-flop storage cell 103. The flip-flop storage cell 103 includes an N-channel transistor M14 having its source connected to the low-power supply Vss and its drain connected both to the drain of P-channel transistor M18 and to the source of N-channel M19. Similarly, P-channel transistor M13 has its drain connected to both the drain of P-channel transistor M18 and the source of N-channel transistor M19. The source of P-channel transistor M13 is connected to the low-power rail Vdd of the circuit 100. The node interconnecting the drain of N-channel transistor M14 and the drain of P-channel transistor M13 provides an input to a second inverter I21. The output of inverter I21 is connected to the gate of N-channel transistor M14 and to the gate of P-channel transistor M13. The output of inverter I21 is further connected as an input to a third inverter I27. The output of inverter I27 provides a single bit Q data output of the memory cell circuit 100. The output of inverter I27 is also fed through a fourth inverter I28 to provide an inverse output of the Q data signal, i.e. –Q.

In the operation of the trim read cell circuit 100, the fuse R23 is either selectively blown or not blown at circuit test. The fuse R23 is blown by applying a suitable voltage between Vdd and the trimpad node 101.

Application of 1 bit of a programming test vector at the trimpad node 101 stores the bit value in the flip-flop 103 during generation of a read input trigger pulse on power up. Utlization of the blown fuse allows the data output Q of the flip-flop 103 to be read and its value retained while no current is used by the cell 100 in the steady state.

Figure 2:
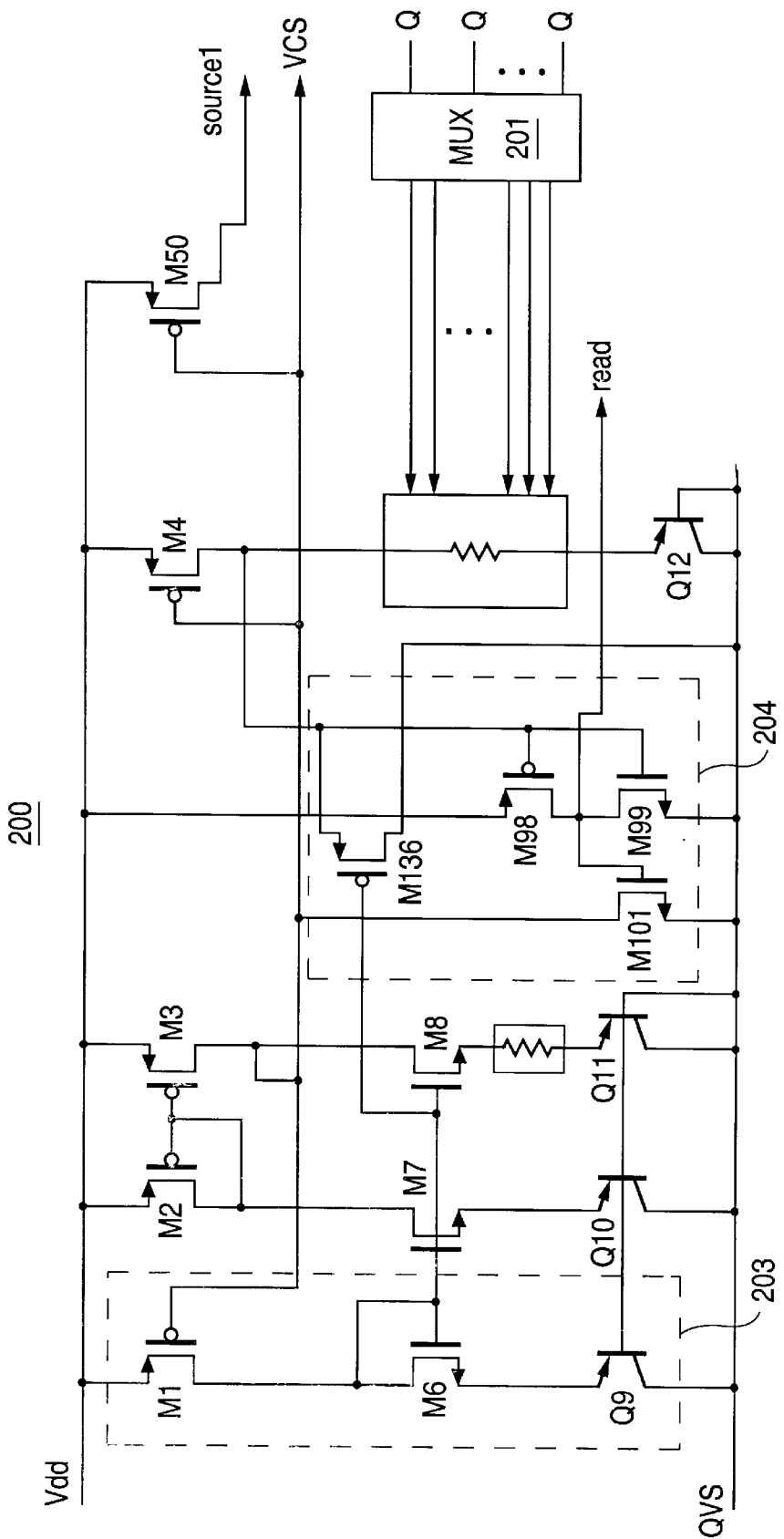
FIG. 2 is a schematic drawing illustrating a bandgap reference circuit that utilizes a polyfused trim read cell in accordance with the present invention.

FIG. 2 shows a bandgap circuit 200 that utilizes the concepts of the FIG. 1 trim cell circuit 100.

As shown in FIG. 2, a plurality of trim read cells 100 can be utilized to provide multiple trim bit inputs Q to an analog multiplexer 201 of the bandgap circuit 200. The analog mux 201 sets the value of a resistive ladder 202 in the bandgap circuit, thereby providing the desired trim.

More specifically, the bandgap circuit 200 includes a start-up branch 203 that includes P-channel device M1, N-channel device M6 and PNP-bipolar transistor Q9. P-channel transistor M1 has its source connected to the positive rail Vdd and its drain connected to the drain of N-channel transistor M6. The drain of N-channel transistor M6 is also commonly connected with its gate. The source of N-channel M6 is connected to the emitter of PNP device Q9. The collector of bipolar device Q9 is connected to the negative power supply Avs. The gate of P-channel transistor M1 is connected to output voltage supply Vcs. The gate of N-channel transistor M6 is commonly connected to the gate of N-channel M7 and the gate of N-channel transistor M8. The base of PNP device Q9 is commonly connected to the base of PNP device Q10 and to the base of PNP device Q11.

As further shown in FIG. 2, the bandgap circuit 200 includes a current mirror comprising matched PMOS devices M2 and M3. The commonly connected gate/drain node of PMOS device M2 is connected to the drain of N-channel transistor M7. The source of N-channel transistor M7 is connected to the emitter of PNP device Q10. The collector of PNP device Q10 is connected to the negative rail Avs. Similarly, the drain of PMOS device M3 is connected to the drain of N-channel transistor M8. The source of N-channel transistor M8 is connected to the emitter of PNP device Q11 via a resistor R3. The collector of PNP device Q11 is connected to the negative rail Avs.

The bandgap circuit 200 also includes a bandgap pulse generator 204 that serves as the source of the read trigger pulse provided to the trim read cell 100 on power up. The bandgap pulse generator 204 includes NMOS transistor M101, NMOS transistor M99, and PMOS device M98. NMOS device M101 has its source connected to the negative rail Avs and, its drain connected to the voltage output Vcs and its gate connected to the commonly connected drains of NMOS device M99 and PMOS device M98. The source of NMOS device M99 is connected to the negative rail Avs, while the source of PMOS device M98 is connected to the positive rail Vdd. The gate of NMOS device M99 is commonly connected to the gate of PMOS device M98, and both are connected to the source of a PMOS clamping overshoot device M136.

Clamp overshoot device M136 has its gate connected to the commonly connected gates of NMOS device M6, M7 and M8. The drain of clamp overshoot device M136 is connected to the negative supply Avs.

Bandgap circuit 200 also includes a PMOS device M4 which has its source connected to the positive supply Vdd, its gate connected to the output voltage Vcs and its drain connected to a polysilicon trim fuse circuit 300. The other end of the fuse circuit 300 is connected to the emitter of PNP device Q12. PNP device Q12 also has both its collector and its base connected to the negative rail Avs.

As shown in FIG. 2, bandgap circuit 200 further includes PMOS device M50 which has its source connected to the positive rail Vdd, its drain connected to output source 1 and its gate connected to the output voltage Vcs.

As indicated in FIG. 2, the multiple outputs of resistive ladder 300 are provided through a analog multiplexer which provides a trim bit circuit output.

It should be understood that various alternatives to the embodiments of the invention described herein may be employed in practicing the invention. Thus, it is intended that the following claims define the scope of the invention and that methods and structures within the scope of these claims and their equivalents be covered thereby.

What is claimed is:

1. A fuse trim read cell circuit comprising:
    a transmission gate that includes a first PMOS transistor and a first NMOS transistor, the first PMOS transistor having its gate connected to receive a compliment of a read input signal, its drain connected to a transmission gate output node and its source connected directly to a trimpad node, the first NMOS transistor having its gate connected to receive the read input signal, its drain connected directly to the trimpad node and its source connected directly to the transmission gate output node, whereby an active read input signal turns both the first PMOS transistor and the first NMOS transistor on thereby connecting the trimpad node to the transmission gate output node;
    a second NMOS transistor having its gate connected to receive the read input signal, its drain connected directly to the trimpad node and its source connected directly to a negative power supply;
    a fuse element having a first fuse electrode connected directly to the trimpad node and a second fuse electrode connected directly to positive power supply; and
    a data storage cell connected directly to the transmission gate output for storing a single bit control signal,
    whereby the single bit control signal is provided to an external circuit connected to the fuse trim read cell circuit when the fuse element is blown.

2. A trim read cell as in claim 1, and wherein the fuse element comprises polysilicon.

3. A fuse trim read cell circuit comprising:
    an input inverter that receives a read signal as an input and provides a compliment of the read signal as an output;
    a transmission gate that includes a first P-channel transistor having its gate connected directly to the output of the input inverter, its source connected directly to a trimpad node and its drain connected directly to a transmission gate output node, and a first N-channel transistor having its gate connected to receive the read signal, its drain connected directly to the trimpad node and its source connected directly to the transmission gate output node such that, when the read signal is active high, the trimpad node is connected to the transmission gate output node;
    a second N-channel transistor having its gate connected to receive the read signal, its source connected directly to a negative power supply and its drain connected directly to the trimpad node;
    a polysilicon fuse connected between the trimpad node and a positive power supply; and
    a storage cell connected to the transmission gate output node for storing a single bit control signal,
    whereby the single bit control signal is provided to an external circuit connected to the fuse trim read cell when the polysilicon fuse is blown.

4. A trim read cell circuit as in claim 3, and wherein the storage cell comprises a flip-flop that includes:
    an output inverter having an input connected to the transmission gate output node;
    a second P-channel transistor having its gate connected directly to an output node of the output inverter, its source connected to the positive power supply and its drain connected to the transmission gate output node; and
    a third N-channel transistor having its gate connected directly to the output node of the output inverter, its source connected to the negative power supply and its drain connected to the transmission gate output node.

5. A trim read cell circuit as in claim 4, and further comprising:
    a first data output inverter having an input connected to the output node of the output inverter and to a data output node; and
    a second data output inverter having an input connected to the data output node of the first data output inverter such that the second data output inverter provides a complimentary data output.

* * * * *